United States Patent [19]

Nakajima

[11] 4,354,897

[45] Oct. 19, 1982

[54] PROCESS FOR FORMING CONTACT THROUGH HOLES

[75] Inventor: Makoto Nakajima, Tokyo, Japan

[73] Assignee: Fujitsu Limited, Kawasaki, Japan

[21] Appl. No.: 234,194

[22] Filed: Feb. 13, 1981

[30] Foreign Application Priority Data

Feb. 14, 1980 [JP] Japan .................................. 55-16858

[51] Int. Cl.³ ........................ B44C 1/22; H01L 21/306
[52] U.S. Cl. .................................. 156/643; 156/644; 156/651; 156/659.1; 430/316
[58] Field of Search ............ 156/643, 644, 651, 659.1, 156/645; 430/316

[56] References Cited

U.S. PATENT DOCUMENTS 3,544,401 12/1970 Jarman ................................ 156/657
3,695,955 10/1972 Jochems et al. ................. 156/659.1

Primary Examiner—Edward C. Kimlin
Assistant Examiner—F. K. Wine
Attorney, Agent, or Firm—Staas & Halsey

[57] ABSTRACT

A process for forming a contact through-hole in an insulating layer lying between multilayer conductors comprises the steps of: forming a photoresist layer on the insulating layer with an aperture therein exposing, and defining, the position of a through-hole to be found in the insulating layer; wet-etching the insulating layer in the portion exposed by the aperture to form a preceding hole; heating the photoresist layer to bend the end portion of the photoresist layer into the preceding hole but to a limited extent such that the end portion does not come into contact with sloped side wall of the preceding hole; and dry-etching the insulating layer to complete the etching of the contact through-hole while maintaining the desired, sloped sidewall thereof, thereby preventing cracks from occurring in the upper one of the multilayer conductors in the portions thereof which extend through the through-hole.

9 Claims, 12 Drawing Figures

PROCESS FOR FORMING CONTACT THROUGH HOLES

BACKGROUND OF THE INVENTION

1. Field of the Invention

The present invention relates to a process for forming contact through-holes in a insulating layer of a semiconductor device such as an integrated circuit (IC).

2. Description of the Prior Art

In the production of a semiconductor integrated circuit, a portion of an insulating layer for protection (i.e. a passivation film) is selectively removed to make a through-hole (i.e. a via hole) and then an upper conductor layer (i.e. a conductive pattern) is formed on the insulating layer so as to come into contact with a lower conductor layer (i.e. another conductive pattern) through the through-hole. In this case, it is possible to generate cracks in the upper conductor layer (e.g. aluminum) at the edge of the insulating layer defining the through-hole. As a result, a disconnection i.e., a discontinuity between the upper and lower conductor layers may occur. Accordingly, in order to prevent cracks from occurring, it is important to eliminate the edge of the insulating layer at the juncture of the sidewall defining the through-hole and the upper surface of the insulating layer, and instead to shape the side surface of the through-hole into a slope.

Various etching methods for forming a through-hole having a slope have been proposed. For example, a portion of an insulating layer on a conductive layer can be selectively removed through an opening in a patterned photoresist mask by using an etching solution to form the through-hole. Such a wet-etching method is explained in detail, referring to FIGS. 1 and 2. An insulating layer (e.g. a phosphosilicate glass film) 1 is formed on a conductor layer (e.g. an aluminum pattern) 2 lying on another insulating layer (e.g. a silicon dioxide layer) 3 and a semiconductor substrate (e.g. a single crystalline silicon substrate) 4. A photoresist layer 5 is applied on the insulating layer 1 and then is exposed and developed to form a pattern mask having an opening 6, as illustrated in FIG. 1. A portion of the insulating layer 1 (e.g. of phosphosilicate glass) is selectively etched by using a suitable etching solution (e.g. a mixed solution of hydrofluoric acid (HF) and nitric acid ($HNO_3$)) to form a through-hole 7, as illustrated in FIG. 2. The through-hole 7 has a larger bottom size and a considerably larger top size thereof than the size of the opening 6 of the photoresist layer 5, since the etching solution can remove the insulating layer 1 from under the edge of the photoresist layer 5 (namely, a so-called undercut or side etching occurs) and over-etching is practically carried out to ensure formation of a number of complete through holes in a number of semiconductor device chips of a semiconductor substrate (wafer). In this case, it is possible to prevent the cracks of an upper conductor layer to be formed from occurring; however, the formed through-hole is made larger than the desired size, so that the density of the conductor pattern and the density of the integrated circuit are low.

By decreasing the undercut, a contact through-hole can be formed by combining wet-etching and dry-etching. An exposed portion of the insulating layer 1 (FIG. 1) is wet-etched by the etching solution through the opening 6 of the photoresist layer 5. For example, as shown in FIG. 3A, the insulating layer 1 having a thickness of 1.0 micron is wet-etched to form a preceding hole 8 having a depth of 0.7 microns; as a result, a portion of the insulating layer having a thickness of 0.3 microns remains. Then, in a conventional dry-etching (e.g. reactive sputter etching, plasma etching) apparatus, the insulating layer 1 is further etched to complete a through-hole 9, as illustrated in FIG. 3B. The formed through-hole 9 has a smaller bottom size and a slope of a larger angle as compared with the through-hole 7 (FIG. 2) formed by wet-etching only. In this case, since there is a space between the bottom plane of the photoresist layer 5 and the sloped sidewall (inclined plane) of the preceding hole 8, dry-etching causes partial removal of the insulating layer 1 from under the photoresist layer 5, resulting in a small undercut. Thus, the through-hole 9 is slightly larger than the desired size.

In another case, the insulating layer 1 having a thickness of 1.0 micron is wet-etched to form a preceding hole 10 having a depth of 0.3 microns, as illustrated in FIG. 4A. Then, in the same dry-etching apparatus as in the case of FIGS. 3A and 3B, the insulating layer 1 is further etched to complete a through-hole 11, as illustrated in FIG. 4B. The formed through-hole 11 has an almost vertical side surface and only a short portion having a slope, formed initially by wet-etching. Since the through-hole 11 does not have a slope extending over the whole depth of the hole, cracks may occur in a conductor layer (not shown, but formed by a conventional process) formed on the insulative layer 1 at the edge of the through-hole 11, where that conductor layer extends through the through-hole 11 to contact an exposed portion of the conductor layer 2.

SUMMARY OF THE INVENTION

An object of the present invention is to provide a process for forming in an insulating layer, a contact through-hole having a sloped sidewall which prevents cracks from occurring in a conductor layer to be formed on the insulating layer and extending through the through-hole on the sloped sidewall of the hole.

Another object of the present invention is to promote a density increase in the integrated circuit of a semiconductor device by accurately forming the contact through-hole into a desired size.

The above and other objects of the present invention are attained by a process for forming a through-hole in an insulating layer for providing a connection between an upper conductor layer and a lower conductor layer respectively disposed in the upper and lower surfaces of the insulating layer, which process comprises the steps of: forming a patterned photoresist layer serving as a mask on the upper surface of the insulating layer; wet-etching an unmasked (i.e., exposed) portion of the insulating layer to form a preceding hole; heating the photoresist layer to bend the end portion of the photoresist layer into the preceding hole; and dry-etching the exposed portion of the insulating layer to complete the through-hole having a sloped sidewall. Since heating bends the end portion of the photoresist layer to such a controlled extent that the end portion does not come into contact with the sidewall of the preceding hole, the through-hole having a sidewall with the desired degree of slope can be formed by dry-etching without any enlargement of the size of the preceding hole at the upper surface of the insulating layer.

DESCRIPTION OF THE PREFERRED EMBODIMENT

Referring now to FIGS. 5A through 5D, a process in accordance with the invention for forming a contact through-hole in an insulating layer which lies between multilayer conductors of a semiconductor device, will be explained in more detail.

Figure 1:
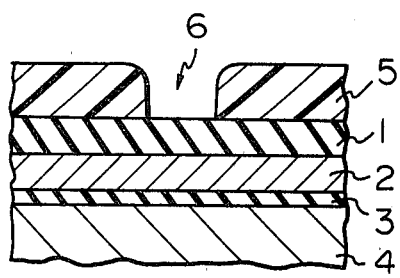
FIG. 1 is a partial cross-sectional view of a semiconductor device having a mask, or photo-resist layer thereon with an aperture defining the position of a contact through-hole to be formed.
Figure 2:
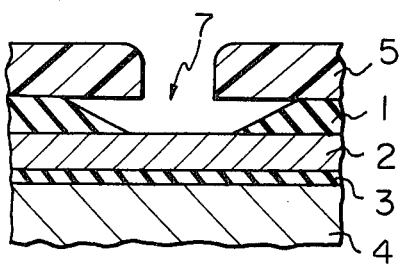
FIG. 2 is a partial cross-sectional view of a semiconductor device having a contact through-hole therein formed by wet-etching only.
Figure 3A:
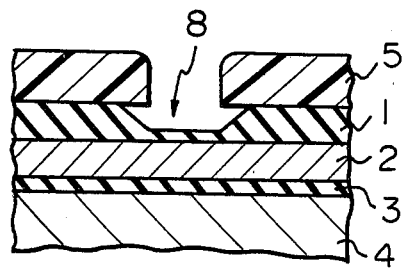
FIGS. 3A and 3B are partial cross-sectional views of a semiconductor device having a preceding hole formed in an insulating layer thereof by wet-etching only, and having a complete through-hole therein formed by dry-etching, respectively.
Figure 3B:
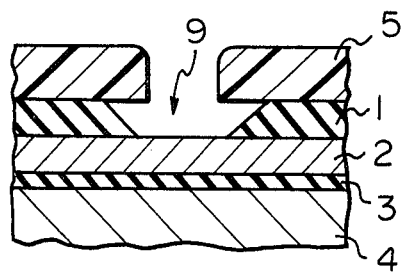
Figure 4A:
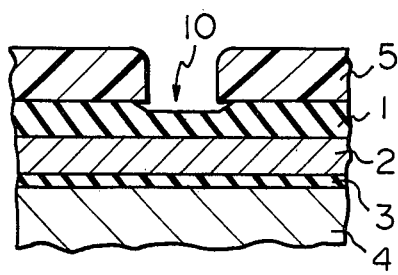
FIGS. 4A and 4B are partial cross-sectional views of a semiconductor device having a shallow preceding hole formed in an insulating layer thereof by wet-etching only and having a complete through-hole formed by dry-etching, respectively.
Figure 4B:
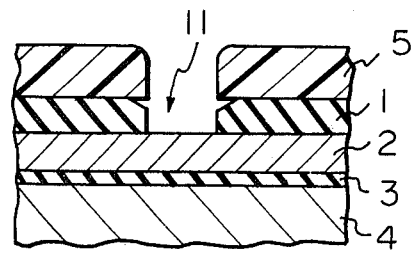
Figure 5A:
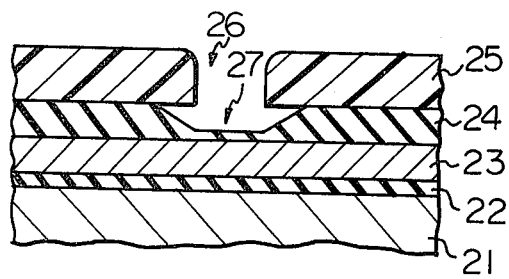
FIGS. 5A through 5D are partial cross-sectional views of a semiconductor device with multilayer conductors, in various stages of its manufacture by a method in accordance with the present invention.

On a semiconductor substrate (e.g. a single crystalline silicon substrate) 21 (FIG. 5A) a first insulating layer (e.g. a silicon dioxide layer) 22 is formed by a suitable method (e.g. a thermal oxidation method). The semiconductor substrate has active elements and passive elements as integrated circuit elements. A first conductor layer 23 made of metal (e.g. aluminum) and having a desired pattern is formed on the first insulating layer 22 by a conventional process (e.g. vapor deposition and then photoetching). Then, a second insulating layer 24 of phosphosilicate glass (PSG) having a thickness in the range of from 0.8 to 1.2 microns (e.g. approximately 1.0 micron) is formed on the first conductor layer 23. It is possible to use silicon dioxide ($SiO_2$), silicon nitride ($Si_3N_4$) or borosilicate glass (BSG) instead of phosphosilicate glass. A positive type photoresist layer 25 having a thickness in the range of from 1.0 to 2.0 microns (e.g. approximately 1.5 microns) is coated on the second insulating layer 24 and then selectively removed to make a desired opening (i.e., aperture) 26. It is also possible to use a negative type photoresist (e.g. OMR-83 produced by Tokyo Ohka Kogyo) instead of a positive type photoresist (e.g. AZ 1350 produced by Slipley). A portion (having a thickness in the range of from 0.5 to 0.8 microns, e.g. approximately 0.7 microns) of the second insulating layer 24 of PSG is selectively etched by an etching solution of acid ammonium fluoride and nitric acid through the opening 26 to form a preceding hole 27, as illustrated in FIG. 5A. Since the etching solution causes a so-called undercut, the preceding hole 27 has a sloped sidewall. When the second insulating layer 24 of $SiO_2$, $Si_3N_4$ or BSG is selectively wet-etched, a suitable etching solution for the used material (e.g. mixture of hydrofluoric acid and alcohol) should be used. Since nitric acid or alcohol exist in the etching solution, the etching solution penetrates into the interface of the photoresist layer 25 and the insulating layer 24 to generate a large undercut 27 at the upper portion of the insulating layer 24.

Figure 5B:
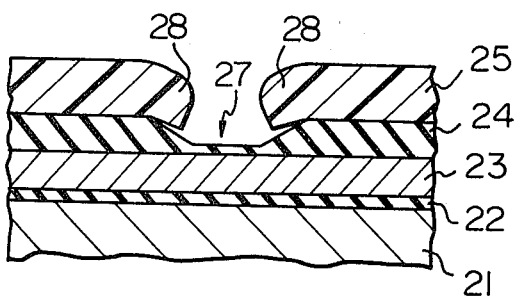

Next, the photoresist layer 25 is heated up to the softening point thereof to bend the end portion 28 (i.e., that portion of the photoresist layer 25 defining, and adjacent to, the opening 26) of the photoresist layer 25 into the preceding hole 27. When the above heat-treatment is carried out, it is necessary to keep the end portion 28 off (i.e., displaced from) the sloped sidewall of the preceding hole 27, as illustrated in FIG. 5B. For example, in a case where the positive type photoresist layer 25 with a thickness of 1.5 microns is used, it is sufficient to heat the photoresist layer at a temperature in the range of 160° to 180° C. (preferably 170° C.) for a period in the range of from 10 to 40 minutes (preferably 20 minutes). The heating temperature and the length of time depends on the thickness and the properties of the photoresist layer 25 actually used.

Figure 5C:
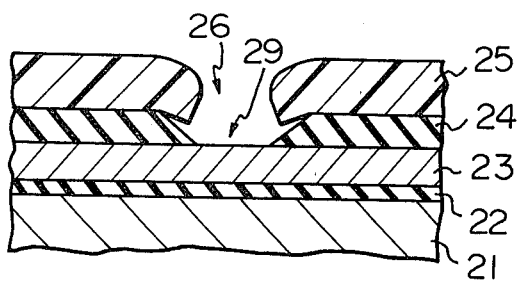

The exposed portion of the second insulating layer 24 is dry-etched through the window 26 by reactive sputter etching or plasma etching to complete a through-hole 29, as illustrated in FIG. 5C. In this case, the dry-etching causes a smaller undercut as compared with the previous wet-etching step and the opening, i.e., the through-hole 29, as thus formed in the photoresist layer 25 is shaped as a truncated cone, so that the formed through-hole 29 has a sloped sidewall. Since the space between the bottom plane of the photoresist layer 25 and the sloped sidewall of the preceding hole 28 (FIG. 5B) is small, the top plane size of the preceding hole 28 is not enlarged by the dry-etching. For example, after the heat-treatment for bending the end portion 28 (FIG. 5B), the PSG insulating layer 24, having the preceding hole 27 formed to be 0.7 microns deep, can be etched by reactive sputter etching in a planar type dry-etching apparatus under the following conditions: a power density of 0.7 watt/cm² of a silicon substrate, a pressure of 0.2 Torr, $CHF_3$ etchant gas and a period of 5 minutes. As a result, the sloped sidewall of the through-hole 29 has an angle in the range of from 18 to 30 degrees. It is possible to use $CF_4$ or $C_2F_6$ as an etchant gas instead of $CHF_3$. If the insulating layer 24 is made of $SiO_2$, $Si_3N_4$ or BSG, one of the above etchant gases $CHF_3$, $CF_4$ and $C_2F_6$ can be used.

Figure 5D:
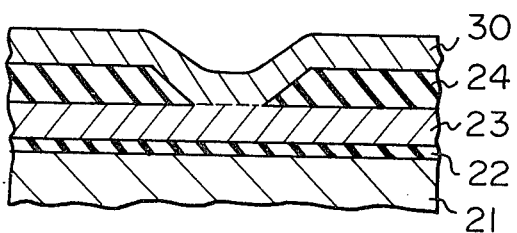

Then, the photoresist layer 25 is removed. A second conductor layer 30 made of metal (e.g. aluminum) and having a desired pattern is formed on the second insulating layer 24 by a conventional process. The formed second conductor layer 30 comes into contact with the first conductor layer 23 through the through-hole 29, as illustrated in FIG. 5D. The slope of the sidewall of the through-hole 29 thus prevents cracks occurring in the second conductor layer 30.

It is important to successful practice of the invention that the preceding hole be of sufficient depth such that extensive dry-etching to complete the through-hole through the depth of the insulating layer is not required, and that the bending of the end portion of the photoresist layer not be so great as to cause same to contact the sloped sidewall of the preceding hole. These factors are illustrated by the following example, with reference to FIGS. 6A and 6B.

Figure 6A:
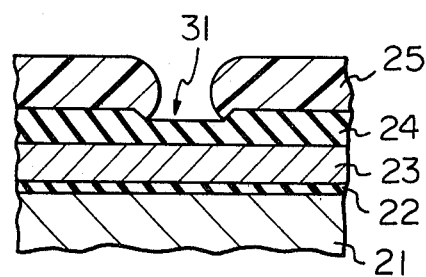
FIGS. 6A and 6B are partial cross-section views of a semiconductor device having a shallow preceding hole in an insulating layer thereof and a bent end portion of a photoresist layer extending into the hole, and having a complete through-hole therein, respectively.
Figure 6B:
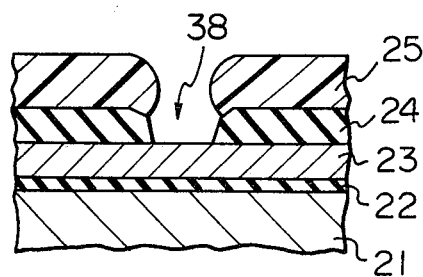

If a preceding hole 31 having a depth of 0.3 microns instead of 0.7 microns as in FIG. 5A is formed in the PSG insulating layer 24 by wet-etching and the photoresist layer 25 is heated at 170° C. for 20 minutes, the end portion of the photoresist 25 comes into contct with the slope of the preceding hole 31, as illustrated in FIG. 6A. Then, a portion of the PSG insulating layer 24 is dry-etched through the opening of the photoresist layer 25 by the reactive sputter etching under the same conditions as the above-mentioned conditions except that an etching period is 8 minutes. As a result, a through-hole 38 having a steep slope is completed, as illustrated in FIG. 6B. After removal of the photoresist layer 25, when a second conductor layer (not shown) is formed on the PSG layer 24 and the exposed portion of the first conductor layer 23, cracks may occur in the second conductor layer at the juncture of the steeply sloped, lower portion and the more moderately sloped upper portion of the sidewall of the through-hole 38. In this case, the period of reactive sputter etching is relatively long and the amount of change in quality of the photoresist layer 25 due to the dry-etching is relatively large. The change in quality of the upper portion of the photoresist layer 25 creates problems in the removal of the photoresist layer 25.

When a contact through-hole in an insulating layer is formed in accordance with the method of the present invention, it prevents cracks from occurring in a conductor layer lying on the insulating layer and extending through, and on, the sloped sidewall of the through-hole. As a result, reliability of semiconductor devices and the yield of good products of semiconductor devices per total number of semiconductor devices to be produced is increased. Furthermore, the top planar dimension of the contact through-hole formed in accordance with the present invention is not enlarged as a result of so-called undercut, so that the through-hole can be accurately shaped into a predetermined size, and whereby the density of the integrated circuit can be increased.

It will be obvious that the present invention is not restricted to the above-mentioned embodiment and that many variations are possible for those skilled in the art without departing from basic idea and scope of the invention.

What is claimed is:

1. A process for forming a through-hole in an insulating layer for providing a connection between an upper conductor layer and a lower conductor layer respectively disposed on the upper and lower surfaces of said insulating layer comprising the steps of:

forming a patterned photoresist layer on the upper surface of said insulating layer comprising a mask having at least one aperture therein for selectively exposing said insulating layer at a portion of said upper surface thereof at which a through-hole is to be formed;

wet-etching said exposed portion of said insulating layer to form a preceding hole having a sloped sidewall and a floor within said insulating layer, wherein the preceding hole is wider at the upper surface than at the floor, said wet-etching undercutting said insulating layer at its upper surface beneath the photoresist layer mask;

heating said photoresist layer to a temperature sufficiently close to the softening point of the photoresist material of said photoresist layer to bend the end portion of said photoresist layer around the said upper surface of said preceding hole, but not into contact with the sloped sidewall of said preceding hole; and dry-etching said insulating layer through said aperture in said photoresist layer mask to complete said through-hole through said insulating layer to said lower surface thereof while maintaining the slope of said sloped sidewall thereof.

2. The process of claim 1 wherein said insulating layer has a thickness in the range of from 0.8 to 1.2 microns.

3. The process of claim 1 or 2 wherein the step of wet-etching the portion of said insulating layer exposed through the aperture of the mask is performed by a suitable etching solution for a sufficient time to remove the insulating layer material to a depth in the range of from 0.5 to 0.8 microns.

4. The process of claim 3 wherein the unmasked portion of said insulating layer is removed by wet-etching to a depth of approximately 0.7 microns.

5. The process of claim 1 wherein said photoresist layer has a thickness in the range of from 1.0 to 2.0 microns.

6. The process of claim 1 further comprising heating said photoresist layer at a temperature in the range of from 160° to 180° C.

7. The process of claim 1 wherein said dry-etching step is carried out by reactive sputter etching or plasma etching.

8. The process of claim 1 wherein said insulating layer comprises a material selected from the group consisting of phosphosilicate glass, silicon dioxide, silicon nitride and borosilicate glass.

9. The process of claim 1 wherein the formation of said through-hole is performed for the production of a semiconductor device.

* * * * *

UNITED STATES PATENT AND TRADEMARK OFFICE
CERTIFICATE OF CORRECTION

PATENT NO.  : 4,354,897
DATED       : October 19, 1982
INVENTOR(S) : Makoto Nakajima It is certified that error appears in the above-identified patent and that said Letters Patent is hereby corrected as shown below:

Col. 1, line 22, after "tinuity" insert --,--;

Col. 2, line 37, after "forming" insert --,--;

line 45, "into" should be --to--;

Col. 3, line 18, after "only" insert --,--;

Col. 5, line 1, "If a..." should be part of preceding paragraph;

line 39, "whereby" should be --thereby--.

Signed and Sealed this

Nineteenth Day of April 1983

[SEAL]

Attest:

GERALD J. MOSSINGHOFF

Attesting Officer  Commissioner of Patents and Trademarks